US010429926B2

(12) United States Patent
Bastian et al.

(10) Patent No.: US 10,429,926 B2
(45) Date of Patent: Oct. 1, 2019

(54) PHYSICAL OBJECT ADDITION AND REMOVAL BASED ON AFFORDANCE AND VIEW

(71) Applicant: INTERNATIONAL BUSINESS MACHINES CORPORATION, Armonk, NY (US)

(72) Inventors: David C. Bastian, Addison, IL (US); Aaron K. Baughman, Silver Spring, MD (US); Nicholas A. McCrory, Sacramento, CA (US); Todd R. Whitman, Bethany, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/459,431

(22) Filed: Mar. 15, 2017

(65) Prior Publication Data

US 2018/0267603 A1    Sep. 20, 2018

(51) Int. Cl.
*G06F 3/01* (2006.01)
*G06T 19/00* (2011.01)
(Continued)

(52) U.S. Cl.
CPC .............. *G06F 3/013* (2013.01); *B60W 50/14* (2013.01); *G06F 3/011* (2013.01); *G06F 17/50* (2013.01);
(Continued)

(58) Field of Classification Search
None
See application file for complete search history.

(56) References Cited

U.S. PATENT DOCUMENTS 6,474,159 B1 *  11/2002  Foxlin ................... A61B 5/1114
                                                         73/488
7,551,089 B2 *   6/2009  Sawyer .................. G01S 7/003
                                                         340/572.4
(Continued)

OTHER PUBLICATIONS

Cockburn et al., Evaluating the effectiveness of spatial memory in 2D and 3D physical and virtual environments, Apr. 20-25, 2002, Proceedings of the SIGCHI conference on Human Factors in Computing Systems, ACM, pp. 203-210 (Year: 2002).*

(Continued)

*Primary Examiner* — Motilewa Good Johnson
(74) *Attorney, Agent, or Firm* — Brian Restauro; Matthew M. Hulihan; Heslin Rothenberg Farley & Mesiti P.C.

(57) ABSTRACT

Physical object addition and removal based on affordance and view. A method tracks eye gaze of a group of users who view an environment, the group of users each having a respective field of view to the environment. The method assesses, based on the tracking, whether an object present in the respective fields of view of the group of users is clutter. The method also initiates a physical change to the environment based on the assessing. In some examples, assessing whether the object is clutter includes determining an extent to which the group of users avoid the object by looking around or away from the object, measuring visual dwell time on and around the object by the group of users, and/or identifying affordances of the object based on input from the group of users and/or on correlating the object to another object having known affordances associated therewith.

20 Claims, 9 Drawing Sheets

(51) Int. Cl.
    *G06T 15/50* (2011.01)
    *G06F 17/50* (2006.01)
    *B60W 50/14* (2012.01)
    *G06K 9/00* (2006.01)

(52) U.S. Cl.
    CPC ..... *G06K 9/00597* (2013.01); *G06K 9/00671* (2013.01); *G06T 15/503* (2013.01); *G06T 19/006* (2013.01)

(56) References Cited

U.S. PATENT DOCUMENTS

| | | | | |
|---|---|---|---|---|
| 7,834,766 B2* | 11/2010 | Sawyer | ............ | G01S 7/003 340/572.4 |
| 8,842,013 B2* | 9/2014 | Sawyer | ............ | G01S 7/003 340/572.4 |
| 8,896,449 B2* | 11/2014 | Sawyer | ............ | G01S 7/003 340/572.4 |
| 8,896,629 B2* | 11/2014 | Meier | ............ | G06F 3/011 345/632 |
| 9,255,813 B2 | 2/2016 | Liu et al. | | |
| 9,341,849 B2 | 5/2016 | Wong et al. | | |
| 9,558,581 B2* | 1/2017 | Wang | ............ | G06T 15/06 |
| 9,704,298 B2* | 7/2017 | Espeset | ............ | G06T 19/006 |
| 2007/0040908 A1* | 2/2007 | Cleveland | ............ | G06K 9/0061 348/78 |
| 2009/0299857 A1* | 12/2009 | Brubaker | ............ | G06Q 30/02 705/14.66 |
| 2011/0141011 A1* | 6/2011 | Lashina | ............ | G06F 3/013 345/156 |
| 2012/0229909 A1* | 9/2012 | Clavin | ............ | G02B 27/017 359/630 |
| 2013/0005285 A1* | 1/2013 | Yin | ............ | H04B 17/009 455/115.1 |
| 2013/0044130 A1* | 2/2013 | Geisner | ............ | G09G 5/00 345/633 |
| 2013/0093787 A1* | 4/2013 | Fulks | ............ | G06T 11/60 345/629 |
| 2013/0093788 A1* | 4/2013 | Liu | ............ | G06F 3/011 345/633 |
| 2013/0115927 A1 | 5/2013 | Gruber et al. | | |
| 2013/0335301 A1* | 12/2013 | Wong | ............ | G02B 27/0093 345/8 |
| 2013/0335435 A1* | 12/2013 | Ambrus | ............ | G06T 19/20 345/589 |
| 2014/0204117 A1* | 7/2014 | Kinnebrew | ............ | G06T 19/006 345/633 |
| 2015/0086077 A1* | 3/2015 | Du | ............ | G06K 9/00369 382/104 |
| 2015/0234457 A1* | 8/2015 | Kempinski | ............ | G06F 3/013 345/156 |
| 2015/0262428 A1 | 9/2015 | Tatzgern et al. | | |
| 2017/0060235 A1* | 3/2017 | Banyay | ............ | G06F 3/013 |
| 2017/0097679 A1* | 4/2017 | Kempinski | ............ | G06F 3/013 |

OTHER PUBLICATIONS

Minelli, Roberto, et al., "I Know What You Did Last Summer: An Investigation of How Developers Spend Their Time", May 2015 ICPC '15: Proceedings of the 2015 IEEE 23rd International Conference on Program Comprehension, pp. 25-35.

Mell, Peter, et al., "The NIST Definition of Cloud Computing", NIST Special Publication 800-145, Sep. 2011, Gaithersburg, MD, 7 pgs.

* cited by examiner

PHYSICAL OBJECT ADDITION AND REMOVAL BASED ON AFFORDANCE AND VIEW

BACKGROUND

The construction of buildings, road signs, structures, or other objects typically follows a prescribed plan of zoning, architecting, and construction. However, some objects that are either proposed to be constructed or already constructed and that people view in an environment may have a negative impact from a civil engineering, landscaping, aesthetic, public safety or other perspective.

SUMMARY

Shortcomings of the prior art are overcome and additional advantages are provided through the provision of a computer-implemented method. The method tracks eye gaze of a group of users who view an environment, the group of users each having a respective field of view to the environment. The method assesses, based on the tracking, whether an object present in the respective fields of view of the group of users is clutter. The method also initiates a physical change to the environment based on the assessing.

Further, a computer program product including a computer readable storage medium readable by a processor and storing instructions for execution by the processor is provided for performing a method. The method tracks eye gaze of a group of users who view an environment, the group of users each having a respective field of view to the environment. The method assesses, based on the tracking, whether an object present in the respective fields of view of the group of users is clutter. The method also initiates a physical change to the environment based on the assessing.

Yet further, a computer system is provided that includes a memory and a processor in communications with the memory, wherein the computer system is configured to perform a method. The method tracks eye gaze of a group of users who view an environment, the group of users each having a respective field of view to the environment. The method assesses, based on the tracking, whether an object present in the respective fields of view of the group of users is clutter. The method also initiates a physical change to the environment based on the assessing.

Additional features and advantages are realized through the concepts described herein.

BRIEF DESCRIPTION OF THE DRAWINGS

Aspects described herein are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1A:
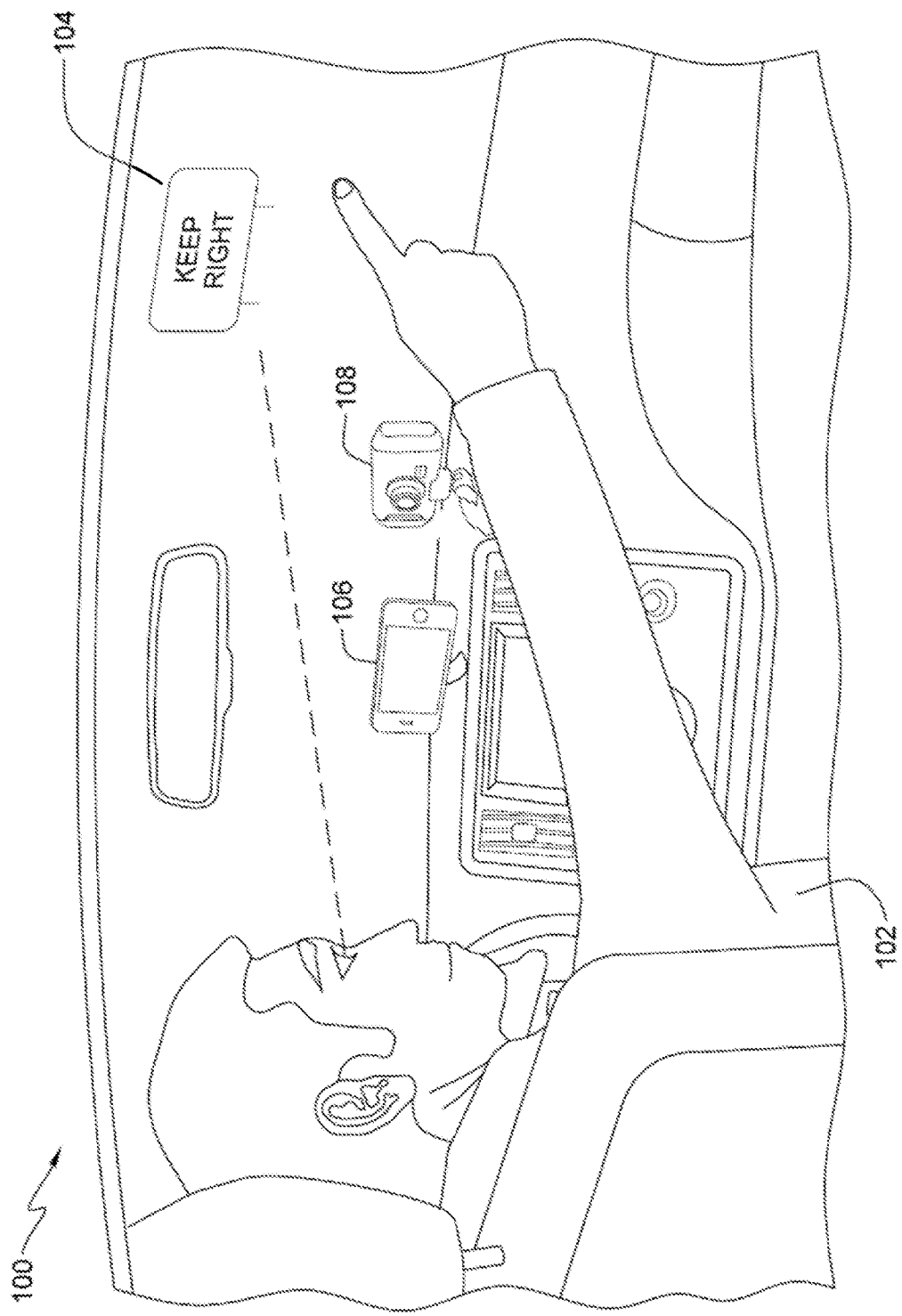
FIGS. 1A and 1B depict an example environment to incorporate and use aspects described herein.

Described herein are facilities for physical object content planning and cleansing based on object affordance and user viewing behavior relative to the object. A proposed construction or removal of an entire structure or other object, or a portion thereof, from an environment can be visualized using augmented reality (AR) to measure eye gaze of individuals viewing the environment, where they want to look, and how they interpret how to use the object. The affordance(s) of the object, referring to possible interactions with the object, can be interpreted at least in part through user utterances of association. People who interact with objects tend to use words that indicate the affordance(s) of the object. These utterances can be gathered, grouped, and associated with the object. This may be done with any object that the user sees, be it in the real world or in a virtual reality (VR) or AR realm. In some examples, users are engaged and prompted to provide utterances, such as words, to associate with an object. The words are then automatically translated to an indication of usage or affordance. In this manner, computer systems (such as smartphones, wearables, or other computer systems) can engage the users in a dialog, asking or reminding the users about a particular object in the environment. It may directly ask the users about affordances or their opinions about the object, for instance by asking the users if they find the object to be useful. From the associated utterances, aspects may be able to deduce what the object is and how it should be used, if at all. If an object is largely ignored, that indicates it may not have significant value in the environment. If the object is an existing physical object in the real world, it may indicate that removal of the object is best. If instead the object was a proposed object for the environment, delivered to users initially in AR, then it may indicate that the proposed construction is not worthwhile or useful.

If an object in AR is deemed to be both useful and non-impeding to users, this supports the case that the AR object should be replicated in the real world, for instance by initiating its construction. Objects may be assessed for removal from the real world by following a related process—for instance by building an AR mockup of the object, possibly removing the physical object at that point, and assessing the reaction of users to the AR object. The AR mockup can be modified or adjusted (e.g. made transparent) to help assess how valuable the object is in the environment. If the assessment is that users generally do not benefit from the physical object, as proven by the AR experiment, then it suggests the object should be removed (if not already) or confirms that it need not exist in the environment.

Thus, the interaction of individuals with objects through AR can lead to physical changes to the physical, real world environment to both declutter the environment of objects whose utility is proven insignificant and demonstrate the utility of objects that could be constructed. Additionally, it could be used to prove the utility of an existing object, for example by building an AR mockup to mask the physical object in the environment and gauge user reaction to the object's hypothetical removal.

By way of specific example, a roadway may have too many traffic signs or banners that may obstruct a scenic view or otherwise impede users from viewing information more important to them, for instance information on another adjacent road sign. In this case, road signs can be scheduled for removal and cloned in AR. The reverse is also true—if enough people viewing the environment through AR look at an AR model of a sign or interact with an AR object as if it were a physical barrier, the object can be scheduled for construction in the real world. In this manner, aspects described herein can be used to test buildings or other construction/deconstruction of objects and their alterations based on affordances and how or whether individuals want to see and interact with those objects. Visual pollution can be minimized to make the environment visually cleaner and potentially safer.

Figure 1B:
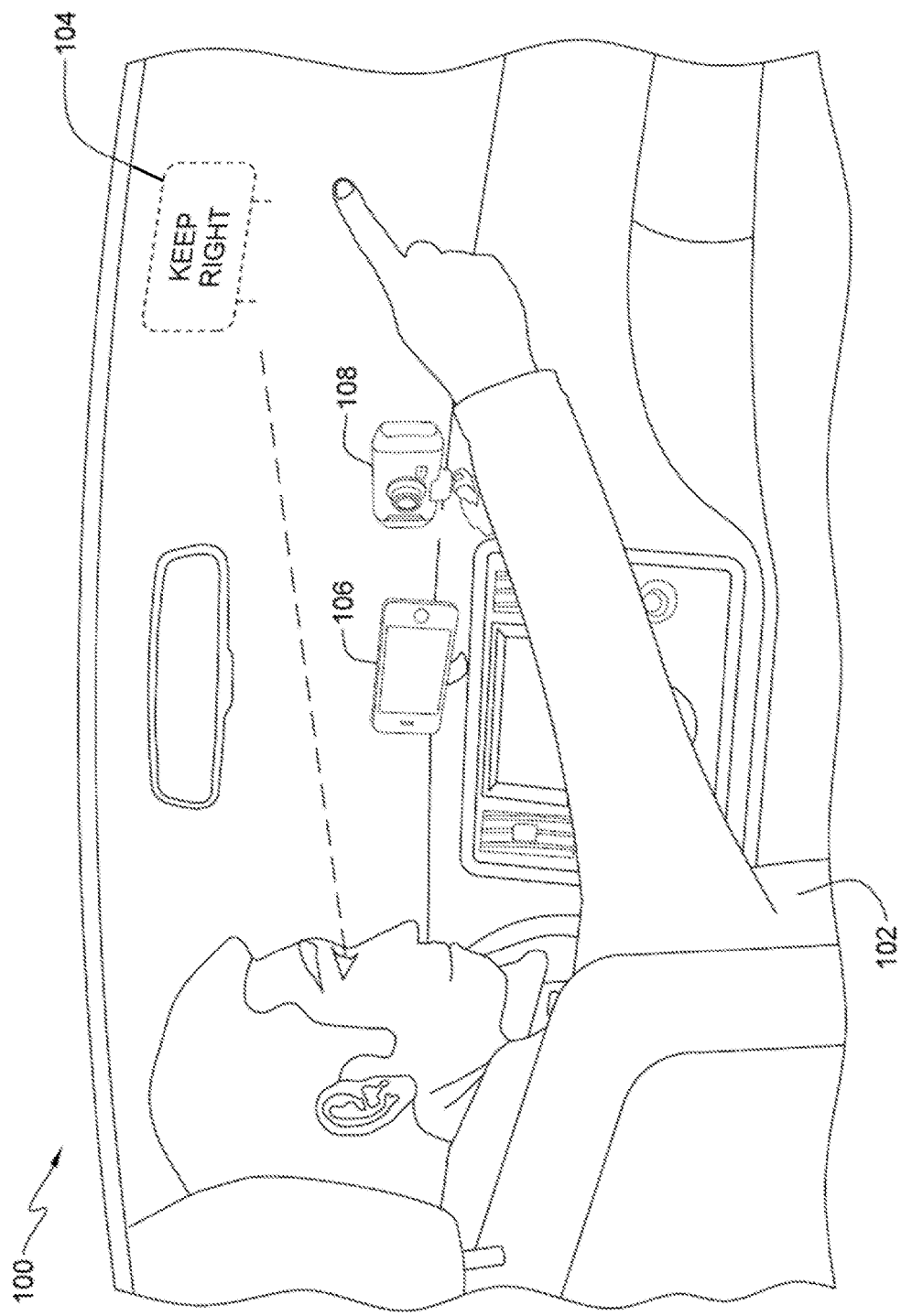

FIGS. 1A and 1B depict an example environment 100 to incorporate and use aspects described herein. The environment also illustrates the example above involving road sign construction. Referring initially to FIG. 1A user 102 drives a vehicle down a roadway and views a road sign 104 next to the road. The dashed line extending from user 102 represents the user's line-of-sight, a component of the user's eye gaze. Accompanying the user in the user's vehicle is the user's smartphone 106 and a separate dash-mounted camera 108, which is oriented to capture images of the user, particularly at least the user's face. In this scenario, camera 108 and/or smartphone 106 function as eye gaze tracking device(s), tracking eye gaze of user 102 having a field of view to the environment. A focus direction, referring to a direction of focus of the user, for example as indicated by the user's line-of-sight, can then be ascertained. A system that includes the smartphone and camera devices, and optionally back-end computer systems that may be local or remote to the user or vehicle, tracks the user's eye gaze by obtaining image(s) of the user's face and determining the line-of-sight by analyzing the images. For instance, dash-mounted camera 108 acquires the image(s) of the user's face, and performs the line-of-sight analysis and/or provides the image(s) to the smartphone 106 over a wireless communication path, such as Wi-Fi or Bluetooth, for the analysis. In other examples, one or more front-facing camera(s) of smartphone 106 acquires image(s) for analyzing to track the user's eye gaze and the dash-mounted camera 108 may or may not be present and may or may not contribute image(s) for the analysis. In addition to images of the user, camera(s), such as a rear-facing camera of smartphone 106, acquires image(s) of the environment in the direction of focus of the user. This captures image(s) of what the user is viewing as the user's eye gaze is being tracked. Based on tracking the user's eye gaze and the images of the environment, software can identify the general area that the user is viewing and possibly identify specific objects within the user's field of view.

To the extent that the user provides utterances, these can be recorded, logged, noted, etc., for instance by the smartphone 106 or by a computer system provided as part of the vehicle. In a particular example, the smartphone 106 includes software, such as a mobile application, that obtains the utterances, images of the environment, and information about the user's eye gaze. Thus, the smartphone 106 can monitor for utterances, such as voice-based utterances in which the user speaks words, that are captured and collect contextual information surrounding the utterance(s), such as an indication of where the user was looking when providing the utterance(s), what the user was looking at, a direction in which the user was facing, and/or where the user was pointing, as examples.

Geographic location may also be ascertained, for instance using global positioning (GPS) information provided by the smartphone's GPS device and/or GPS built into the vehicle, as examples. The geographic location of the user may be useful in identifying the objects known to exist in that location, and therefore in identifying possible objects that the user is viewing in the environment.

In FIG. 1A, user 102 views a road sign 104, which is an existing physical object that has been constructed in the environment 100. As explained herein, an assessment may be conducted based on tracking eye gaze of users viewing the physical road sign, the assessment being of the probability that the road sign is clutter.

FIG. 1B depicts the same situation except user 102 is viewing an AR model of the road sign. The AR model is designated 104' in FIG. 1B and shown in dashed lines. The AR model 104' is interposed in the user's line of sight by drawing the AR model on, in this example, the windshield of the vehicle. The vehicle therefore includes a heads-up display (HUD) or similar technology that allows for AR models to be drawn on/in the windshield, as a transparent display device for displaying AR models. Additionally or alternatively, other manners of delivering an AR experience to the user 102 may be used.

FIGS. 1A and 1B are used to illustrate several possibilities for physical object content planning and cleansing. In the situation of FIG. 1A, a system that includes smartphone 106, camera 108, and optionally other local or remote computer system(s) could track eye gaze of user 102 and other users in the environment to gauge their interaction with road sign 104 and other objects in the environment. The tracking and analysis described herein therefore can occur for several users to build a dataset that accurately reflects an aggregated assessment of general user interaction with the objects. As described herein, this might inform of the utility of road sign 104. It may be the case that users very seldom acknowledge the road sign in its current location. Perhaps they more commonly focus on other road signs in the vicinity or a scenic view behind road sign 104. This may inform or confirm a hypothesis that road sign 104 is not needed or adequately placed in the environment. It may also inform whether the road sign is providing its intended purpose. If drivers in the environment are failing to keep right on the roadway, the system could assess the extent to which the drivers are viewing the sign. If it is found that drivers are not viewing the sign, the system might propose a deletion and relocation of the sign to better serve its purpose.

In the situation of FIG. 1B, the AR model 104' may represent a proposed construction of a road sign informing users to keep right. There may be no physical road sign located in the environment at that location. Instead, the AR model 104' is an object interposed in the lines of sight of the users. The tracking of the eye gaze informs the extent to which the user interacts with the AR model 104' to help inform how effective an actual road sign would be if constructed in that location.

Alternatively with respect to FIG. 1B, perhaps a physical road sign (104) does exist at the location but an assessment is requested of the utility of the road sign 104, similar to the case described above for FIG. 1A. In that case, an AR model (104') of the road sign may be interposed in the users' lines of sight but made transparent against a virtual background that overlays the physical road sign 104 so that the users do not see the physical road sign. Instead, they see the AR model 104' and a virtual background of what the user would see if the physical road sign 104 were not present. Over time, a process can make AR model 104' more transparent and gauge user reaction to the change. This provides a manner in which to gradually, virtually 'delete' a physical object from the environment and assess user reaction, without having to actually deconstruct the object in the real work environment. If user reaction to the 'deletion' is negative, it may be decided that the road sign remain intact. If the reaction to the 'deletion' is positive, then it can initiate or confirm a request to remove the physical road sign 104.

FIG. 1 is just an example environment to incorporate and use aspects described herein. In some embodiments, the vehicle itself is equipped with cameras, a microphone, and software with which the user interacts, the software being built into a computer system of the vehicle, for example. Additionally or alternatively, the user can interact with a wearable mobile device that provides camera(s), a microphone, and software performing aspects described herein. An example such wearable mobile device is a wearable head-mounted device. Additionally, the wearable may also provide AR capabilities. Wearable devices, and in particular head-mounted wearable devices, are inherently designed with ergonomic and other considerations taken into account that can provide a positive AR experience, enabling content to be displayed to a user in a useful manner and integrated into the user's natural view of the surrounding environment. Typically, these devices have a transparent display that can display content thereon while allowing the user a view through the display to the real world environment. Further details of an example wearable device to incorporate and/or use aspects described herein are described below with reference to FIG. 6B.

Figure 2:
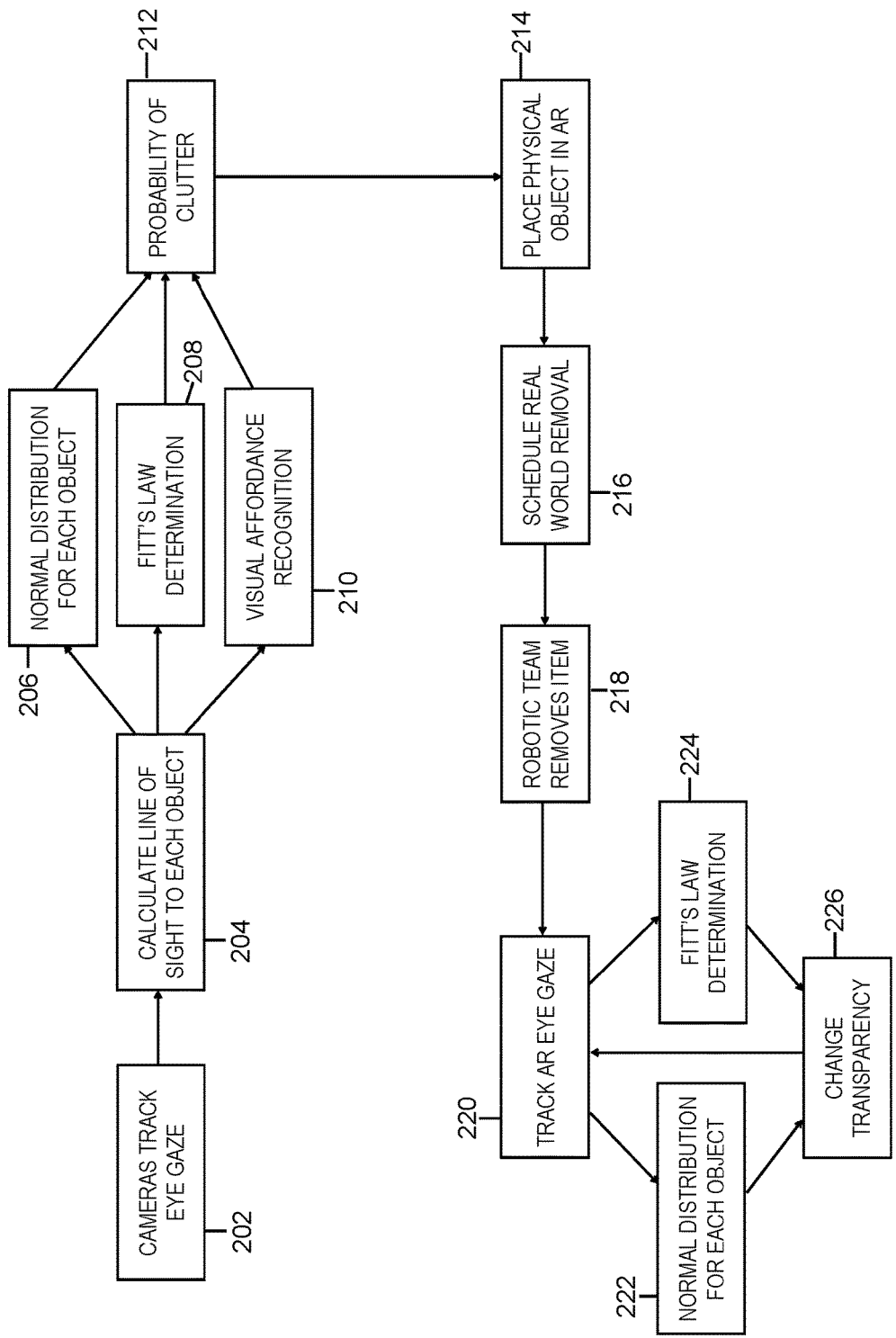
FIG. 2 depicts an example process for physical object content cleansing and planning, in accordance with aspects described herein.

FIG. 2 depicts an example process for physical object content cleansing and planning, in accordance with aspects described herein. Camera(s), for instance of wearable computer system(s) and/or standalone external camera(s), track (202) eye gaze of a first group of users having respective fields of view to an environment. The process determines (204) based on that tracking the lines-of-sight to given object(s). As eye gazes of the first group of users are tracked, objects within the fields of view are detected and recognized.

Then the process makes an assessment, based on the tracking, of whether an object present in the fields of view of the first group of users is clutter. This may be based on a probability of clutter determination. In this example, the probability of clutter is trained based on three aspects. In a first aspect, the process builds (206) a normal distribution model for each object over time that indicates the probability or extent to which the first group of users are trying to avoid the object (in the visual sense) by looking around it or away from it, and optionally in the physical sense as well. The tracked eye gazes might inform that users tend to avoid looking directly at the object, instead looking at surrounding objects with much higher frequency.

In another aspect of the clutter assessment, the process uses a Fitt's Law measurement (208) to gauge visual dwell time on and around the object, between objects in the fields of view, and/or sequence of objects viewed. These measures can indicate the importance of the object. If, for instance, it is a narrow object relative to nearby objects but users visually dwell on the object for a longer amount of time relative to the nearby objects, then the object may be more important than a nearby larger object on which users visually dwell for a shorter amount of time. Conversely, a user might stare at an object for an unusual amount of time when the object actually is clutter. Hence, the significance of the Fitt's Law measurement may be ascertained in conjunction with the information gleaned from the other aspects of the clutter assessment.

In yet another aspect of the clutter assessment, the object is interpreted (210) for visual affordance, for instance based on input (voice utterances, dialog with user, prompts to the user for physical or voice input, etc.) from the first group of users, and/or based on correlating the object to another object having known affordances associated therewith, for example using an ensemble of Haar classifiers. In this latter regard, the process might look in a database for affordances of an object that the system believes to be the same or similar as the object in the field of view that the user is viewing. Object recognition may be used against images of the user's field of view and the recognized objects may be compared to known objects to identify affordance information about the known objects that can be imputed to the recognized objects. Coupled with other inputs like user input (e.g. utterances), the system can learn over time what the affordances are of different encountered objects.

The three above aspects of the clutter assessment are used to train a probability of clutter determination 212. For instance, they may be placed into a probability density function to determine a confidence level that each physical object is clutter. It is also noted that what is clutter to one user may not be clutter to another user. Therefore, a determined probability of clutter may be relative to a particular individual or group of individuals.

In any case, assuming the probability of clutter satisfies some criteria, the process initiates a physical change to the environment based on that assessment. The change may be construction of a proposed physical object (e.g. the object being assessed for clutter is an AR model of the proposed object and a low enough aggregated probability of clutter was determined for the object) or removal of an actual object (e.g. the object being assessed for clutter was the physical object or an AR model of the physical object and the aggregated probability of clutter exceeds some threshold for removal). The process of FIG. 2 illustrates the situation where the assessment was made by tracking eye gaze to the physical object. The process proceeds by placing the physical object in AR, e.g. by modeling it in AR (214). This may be done by any device configured to provide an AR overlay, such as a vehicle HUD or head-mounted wearable device, as examples. The process then schedules the real world removal of the physical object (216).

The physical object is at some point moved/removed from the environment (218), which may be performed by a robotic team as one example. After the object has been removed and placed in AR, the process can proceed by again tracking eye gaze (220), this time the AR eye gaze—that is, eye gaze of users who view the AR model of the object. The process in this regard performs an assessment similar to the prior assessment (204, 206, 212), but this is performed based on eye gaze of a second group of users, which may or may not be the same group as the first group. Depending on the particular environment and object involved, the same or different users may view the object during the different assessment time periods. It is highly unlikely that the exact same set of users will pass by a particular road sign during initial assessment of the physical object and then during the subsequent assessment of the AR model of the object at that location.

The process places the AR model of the object in fields of view of the second group of users who view the environment, and repeats the tracking and the assessing for the AR model of the object, to assess based on interaction of that second group of users with the AR model of the object whether the physical object is properly removed from the environment. Repeating the assessing may not involve all of the same aspects, as is the case in the example of FIG. 2 where the Fitt's law measurement (222) and normal distribution (224) aspects are used but the visual affordance aspect is not used. The process additionally changes transparency (226) of the AR model of the object so the users need not look around the object. It can also additionally provide for slowly 'deleting' the object from the environment. The application of different levels of transparency to the AR model can depend on how much the object being is regarded as clutter. In some examples, the system tracks eye gaze of users and sees that they frequently visually skip or ignore a middle object between two end objects. In that case, the system can slowly make the middle object increasingly more transparent until disappearance, unless users respond negatively to this action.

The repeating of the assessment after the physical object is removed may be desired to monitor whether the object should again be physically constructed. It may be that an object that was clutter becomes more useful at a later time or under other circumstances; the AR assessment after a physical object was removed could be used to determine whether to bring back or reconstruct the physical object. It can also serve as a check on whether the initial assessment that lead to object removal (216, 218) was proper.

It is seen from the above that the probability measure of clutter can be trained by supervised training data, which may be collected and verified or labeled automatically and/or by humans. For example, a database might indicate that a chair present in a particular environment or context tends to be clutter.

In some embodiments, a physical object has been proposed for construction and the object that is the focus of the eye graze tracking and probability of clutter determination is the AR object that is a mockup of the proposed change. Based on determining that the physical object has been proposed for construction in the environment, the system interposes the AR model of the physical object on transparent displays in the lines of sight of the users. The assessment assesses whether the AR model of the physical object is clutter as an indicator of whether the physical object, if actually constructed as proposed, will be clutter in the environment. In this situation, a process initiates a physical change to the environment (e.g. propose or approve a proposed construction in the environment) based on the assessment indicating that the physical object will not be clutter in the environment. It is noted that the object being proposed for deletion or addition can be an alteration to an existing physical object in the environment, rather than an entirely new object altogether.

In an example where an AR model is assessed and a proposed object is built based on the assessment, a process could repeat the tracking for a second group of users who view the environment including the constructed object. Also repeated is the assessment, this time against the constructed object, to assess based on interaction of the second group of users with the constructed object whether the constructed object is clutter. In other words, this assesses whether, after construction, the object that is now present in the real world remains non-clutter. This is effectively a return to the beginning of the process of FIG. 2, where a physical object exists in the environment and the process determines whether it is clutter.

Figure 3:
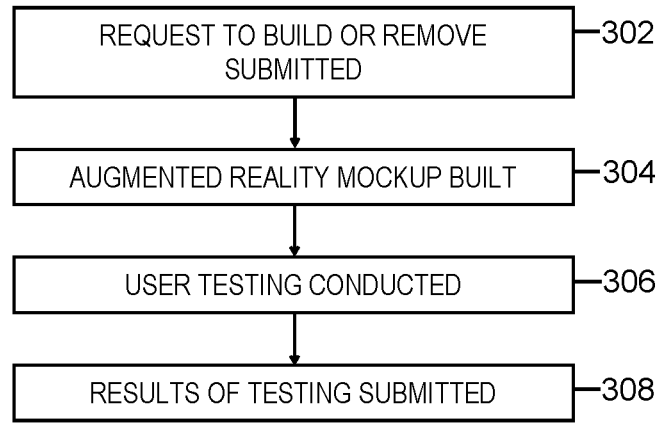
FIG. 3 depicts an example process for augmented reality-based object clutter assessment, in accordance with aspects described herein.

FIG. 3 depicts an example process for augmented reality-based object clutter assessment in accordance with aspects described herein. The process begins with submission of a request to build or remove a potentially obstructing physical object in the real world (302). The process then constructs in AR the appropriate model(s) for the environment in which the object is, or is to be located (304). In the scenario where the request is a removal request to remove an existing physical object, the physical object may or may not be removed during the clutter assessment. If the physical object remains intact, users can activate an AR mode of their devices to activate an AR/VR overlay that shows what would appear when viewing the environment if the object were not present. This may be assisted by cameras installed in the environment that capture images of what would appear behind or in the background of the object as viewed from the vantage point of the users.

The process proceeds by conducting user acceptance testing (306) to determine the effect the object has or will have on sight lines, acoustics, aesthetics, etc. The assessment of acoustics, aesthetics and other non-visual characteristics may leverage systems that provide architectural mockups allowing the testing of these characteristics in a VR environment. An architectural program may allow an administrator or other user to test different materials in a wall or other proposed object to determine what effect the object will have on acoustics in the VR environment and therefore the real world.

Finally, the process submits the results of the above (308) as supporting documentation for or against the proposal to build or remove an object.

Accordingly, aspects described herein provide for scheduling physical object removal and cloning the object in an augmented world as an AR model of the object. Further aspects provide scheduling physical object injection into the real world if an assessment deems that enough users interact with an AR-modeled version of the proposed object, for instance by looking at the object and/or utilizing a significant enough physical purpose. Measures of affordance of both real (actual, physical) and AR-modeled objects by associated user-provided word utterances, perhaps responsive to prompting the users, may factor into the probability of clutter determinations for those objects. The measures of affordance may be considered together with eye gaze viewing experience of users for object planning purposes. In addition, the creation of transparency gradients (on AR models) based on eye gaze can apply different levels of transparency to AR items, for example depending on the extent to which they are deemed to be clutter. As objects become more transparent without causing a negative reaction from the users, then this shows the corresponding physical object in the real world, or proposed for the real world, may be clutter.

Figure 4:
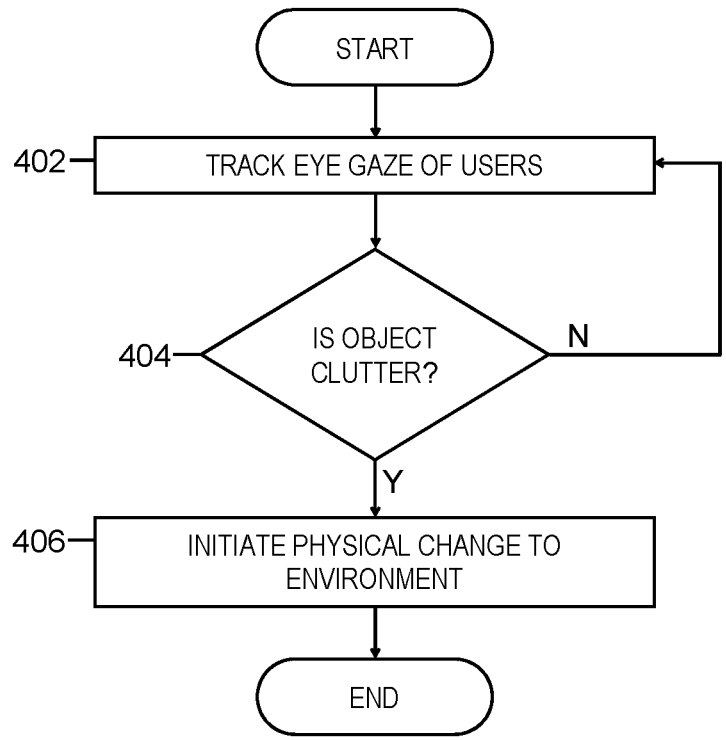
FIG. 4 depicts an example process for physical object addition and removal based on affordance and view, in accordance with aspects described herein.

FIG. 4 depicts an example process for physical object addition and removal based on affordance and view, in accordance with aspects described herein. In some examples, the process is performed one or more computer systems, such as those described herein, which may include one or more mobile devices of users, one or more cloud servers, and/or one of more other computer systems.

The process begins by tracking, using a first one or more eye gaze tracking devices, eye gaze of a first group of users who view an environment (402), where the first group of users each have a respective field of view to the environment. The process then assesses and determines, based on the tracking, whether an object present in the respective fields of view of the first group of users is clutter (404). The object could be a physical object (for instance a physical object that was proposed to be deleted from the environment) or an AR model (for instance of a physical object that was proposed to be added to the environment) interposed in lines of sight of the users.

The assessing/determining (404) can be in the form of a probability of clutter assessment that includes any desired aspects for assessing the probability that the object is clutter. One such aspect may be determining, based on the tracking, an extent to which the first group of users avoid the object by looking around or away from the object. Additionally or alternatively the assessing includes measuring, based on the tracking, visual dwell time on and around the object by the first group of users. Additionally or alternatively the assessing includes identifying affordances of the object based on (i) input from the first group of users, such as voice utterances, dialog with a user, prompts to a user for physical or voice input, etc. and/or (ii) correlating the object to another object having known affordances associated therewith.

If the assessment determines that the object is not clutter, the process can end or, as in FIG. 4, return to 402 to further track eye gaze. Otherwise, the object is clutter, and the process proceeds by initiating a physical change to the environment based on the assessing (406). The initiating may be to schedule a physical object for removal or construction, as examples.

Figure 5:
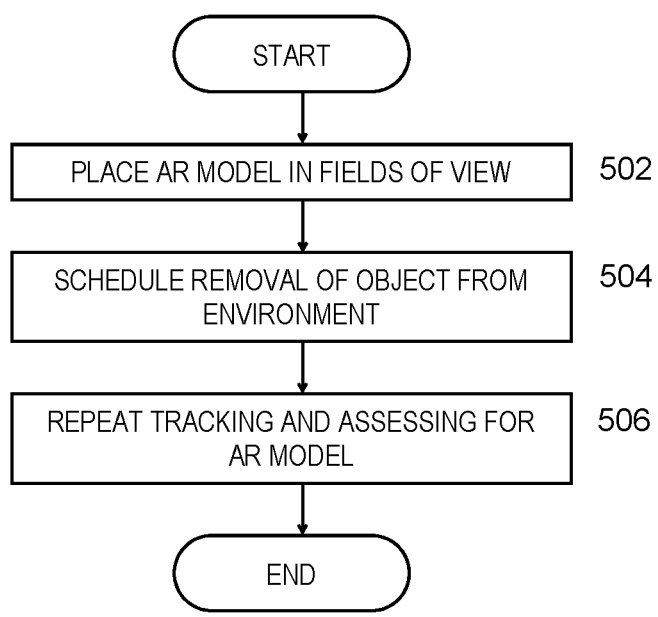
FIG. 5 depicts an example process in which an assessed object is a physical object in the environment, in accordance with aspects described herein.

FIG. 5 depicts an example process in which the assessed object is a physical object in the environment, in accordance with aspects described herein. The process places an augmented reality model of the object in fields of view of a second group of users who view the environment (502). The second group of users could be a same group or different group from the first group of users. Placing the augmented reality model of the object in the fields of view of the second group of users can include interposing the augmented reality model of the object on transparent displays in lines of sight of the second group of users. In other words, for each second user, an AR model is placed on a respective display of/for that user.

The process then schedules removal of the physical object from the environment (504). The scheduling could be definitive instruction to remove the object or a provisional request subject to confirmation based on repeating an assessment about whether the object (as placed in AR) is clutter. In this regard, the process of FIG. 5 proceeds by repeating the tracking and the assessing for the augmented reality model of the object, to assess based on interaction of the second group of users with the augmented reality model of the object whether the (physical) object is properly removed from the environment (506). Repeating the tracking and assessing can use a similar approach to that of the assessing from FIG. 4 except that it tracks eye gaze of the second users and assess the probability that the AR-modeled object is clutter. As noted, it may not be the same group of people who receive the AR model and whose eye gazes are tracked after scheduling the object for removal (or actually removing it immediately).

In some embodiments, placing the augmented reality model of the object in the fields of view of the second group of users further includes varying transparency of the augmented reality model of the object on the transparent displays over time at increasing transparency levels, where repeating the assessing (e.g. 506) includes assessing interaction of the second group of users with the augmented reality model of the object at the increasing transparency levels to determine whether the object is properly removed from the environment. In this way, user reaction is gauged over time as the system tracks through various transparencies of the object, which can factor into the assessment of whether the object is clutter.

Initiating the physical change to the environment (#406, FIG. 4) can be the scheduling from FIG. 5 (#504) or may be a confirmation, after scheduling the removal of the object, that the object is to be removed from the environment, as examples.

In an example of FIG. 4 in which the object is an AR model of a physical object proposed to be constructed in the environment, the process of FIG. 4 can additionally include initially determining that the physical object has been proposed for construction in the environment, and then interposing the augmented reality model of the physical object on transparent displays in lines of sight of the first group of users to present for the first group of users an augmented reality version of the physical object positioned at a location at which the physical object is proposed to be constructed. The assessing in this case can assess whether the augmented reality model of the physical object is clutter as an indicator of whether the physical object, if actually constructed as proposed, will be clutter in the environment. Initiating the physical change to the environment (#406 of FIG. 4) can therefore be based on the assessing indicating that the physical object will not be clutter in the environment, and can include approving a proposal to construct the physical object in the environment.

Additionally as described herein, the physical object proposed to be added or deleted may be an alteration to an existing physical object in the environment, rather than an entirely new structure or other constructed object.

If an assessment based on an AR-model indicates that a physical object should be added to the environment, then based on its construction, (i) the eye gaze tracking may be repeated for a second group of users who view the environment including the constructed object and (ii) the assessing, for the constructed object, may be repeated to assess based on interaction of the second group of users with the constructed object whether the constructed object is clutter.

Although various examples are provided, variations are possible without departing from a spirit of the claimed aspects.

Figure 6A:
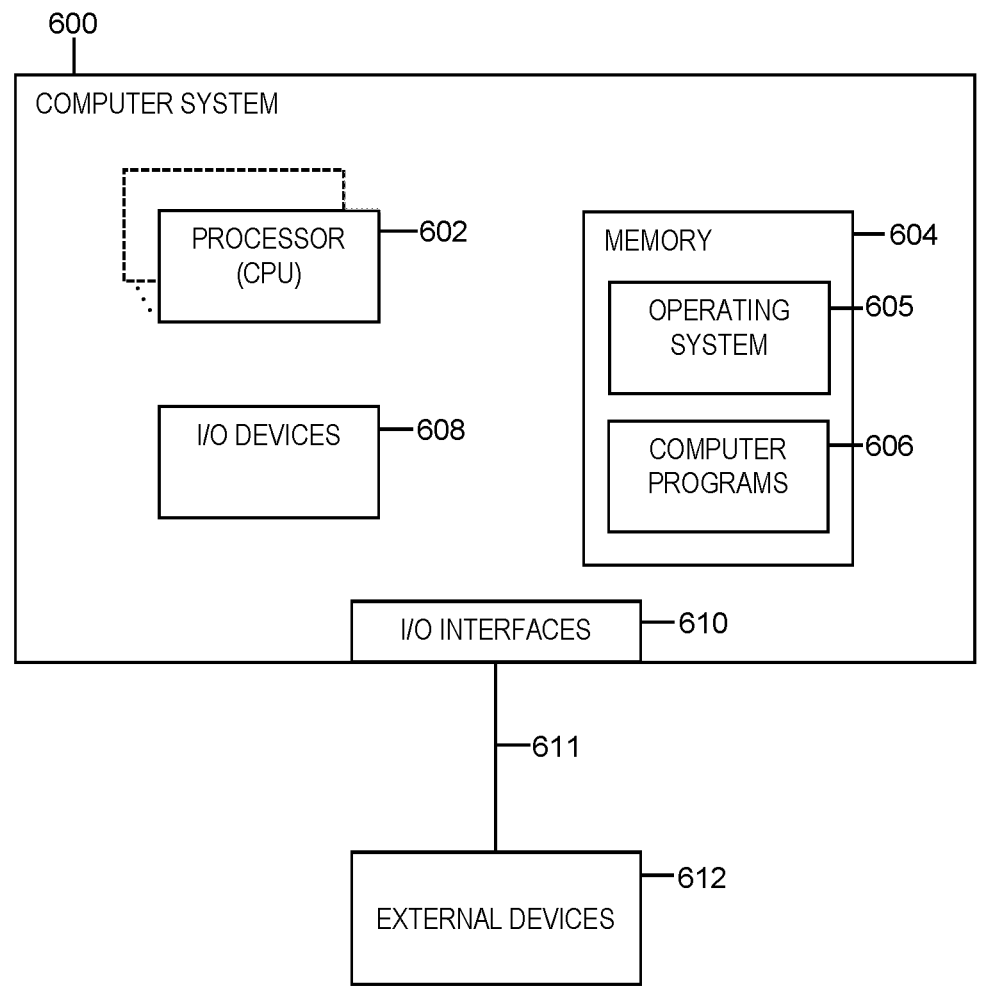
FIG. 6A depicts one example of a computer system and associated devices to incorporate and/or use aspects described herein.

Processes described herein may be performed singly or collectively by one or more computer systems, such as one or more mobile devices, wearable computer systems, servers, cloud computer systems, or a combination of the foregoing, as examples. FIG. 6A depicts one example of such a computer system and associated devices to incorporate and/or use aspects described herein. A computer system may also be referred to herein as a data processing device/system, computing device/system/node, or simply a computer. The computer system may be based on one or more of various system architectures and/or instruction set architectures, such as those offered by International Business Machines Corporation (Armonk, N.Y., USA), Intel Corporation (Santa Clara, Calif., USA) or ARM Holdings plc (Cambridge, England, United Kingdom), as examples.

FIG. 6A shows a computer system 600 in communication with external device(s) 612. Computer system 600 includes one or more processor(s) 602, for instance central processing unit(s) (CPUs). A processor can include functional components used in the execution of instructions, such as functional components to fetch program instructions from locations such as cache or main memory, decode program instructions, and execute program instructions, access memory for instruction execution, and write results of the executed instructions. A processor 602 can also include register(s) to be used by one or more of the functional components. Computer system 600 also includes memory 604, input/output (I/O) devices 608, and I/O interfaces 610, which may be coupled to processor(s) 602 and each other via one or more buses and/or other connections. Bus connections represent one or more of any of several types of bus structures, including a memory bus or memory controller, a peripheral bus, an accelerated graphics port, and a processor or local bus using any of a variety of bus architectures. By way of example, and not limitation, such architectures include the Industry Standard Architecture (ISA), the Micro Channel Architecture (MCA), the Enhanced ISA (EISA), the Video Electronics Standards Association (VESA) local bus, and the Peripheral Component Interconnect (PCI).

Memory 604 can be or include main or system memory (e.g. Random Access Memory) used in the execution of program instructions, storage device(s) such as hard drive(s), flash media, or optical media as examples, and/or cache memory, as examples. Memory 604 can include, for instance, a cache, such as a shared cache, which may be coupled to local caches (examples include L1 cache, L2 cache, etc.) of processor(s) 602. Additionally, memory 604 may be or include at least one computer program product having a set (e.g., at least one) of program modules, instructions, code or the like that is/are configured to carry out functions of embodiments described herein when executed by one or more processors.

Memory 604 can store an operating system 605 and other computer programs 606, such as one or more computer programs/applications that execute to perform aspects described herein. Specifically, programs/applications can include computer readable program instructions that may be configured to carry out functions of embodiments of aspects described herein.

Examples of I/O devices 608 include but are not limited to microphones, speakers, Global Positioning System (GPS) devices, cameras, lights, accelerometers, gyroscopes, magnetometers, sensor devices configured to sense light, proximity, heart rate, body and/or ambient temperature, blood pressure, and/or skin resistance, and activity monitors. An I/O device may be incorporated into the computer system as shown, though in some embodiments an I/O device may be regarded as an external device (612) coupled to the computer system through one or more I/O interfaces 610.

Computer system 600 may communicate with one or more external devices 612 via one or more I/O interfaces 610. Example external devices include a keyboard, a pointing device, a display, and/or any other devices that enable a user to interact with computer system 600. An example particular type of display is a transparent display configured to display augmented reality models thereon. Other example external devices include any device that enables computer system 600 to communicate with one or more other computing systems or peripheral devices such as a printer. A network interface/adapter is an example I/O interface that enables computer system 600 to communicate with one or more networks, such as a local area network (LAN), a general wide area network (WAN), and/or a public network (e.g., the Internet), providing communication with other computing devices or systems, storage devices, or the like. Ethernet-based (such as Wi-Fi) interfaces and Bluetooth® adapters are just examples of the currently available types of network adapters used in computer systems (BLUETOOTH is a registered trademark of Bluetooth SIG, Inc., Kirkland, Wash., U.S.A.).

The communication between I/O interfaces 610 and external devices 612 can occur across wired and/or wireless communications link(s) 611, such as Ethernet-based wired or wireless connections. Example wireless connections include cellular, Wi-Fi, Bluetooth®, proximity-based, near-field, or other types of wireless connections. More generally, communications link(s) 611 may be any appropriate wireless and/or wired communication link(s) for communicating data.

Particular external device(s) 612 may include one or more data storage devices, which may store one or more programs, one or more computer readable program instructions, and/or data, etc. Computer system 600 may include and/or be coupled to and in communication with (e.g. as an external device of the computer system) removable/non-removable, volatile/non-volatile computer system storage media. For example, it may include and/or be coupled to a non-removable, non-volatile magnetic media (typically called a "hard drive"), a magnetic disk drive for reading from and writing to a removable, non-volatile magnetic disk (e.g., a "floppy disk"), and/or an optical disk drive for reading from or writing to a removable, non-volatile optical disk, such as a CD-ROM, DVD-ROM or other optical media.

Computer system 600 may be operational with numerous other general purpose or special purpose computing system environments or configurations. Computer system 600 may take any of various forms, well-known examples of which include, but are not limited to, personal computer (PC) system(s), server computer system(s), such as messaging server(s), thin client(s), thick client(s), workstation(s), laptop(s), handheld device(s), mobile device(s)/computer(s) such as smartphone(s), tablet(s), and wearable device(s), multiprocessor system(s), microprocessor-based system(s), telephony device(s), network appliance(s) (such as edge appliance(s)), virtualization device(s), storage controller(s), set top box(es), programmable consumer electronic(s), network PC(s), minicomputer system(s), mainframe computer system(s), and distributed cloud computing environment(s) that include any of the above systems or devices, and the like.

Figure 6B:
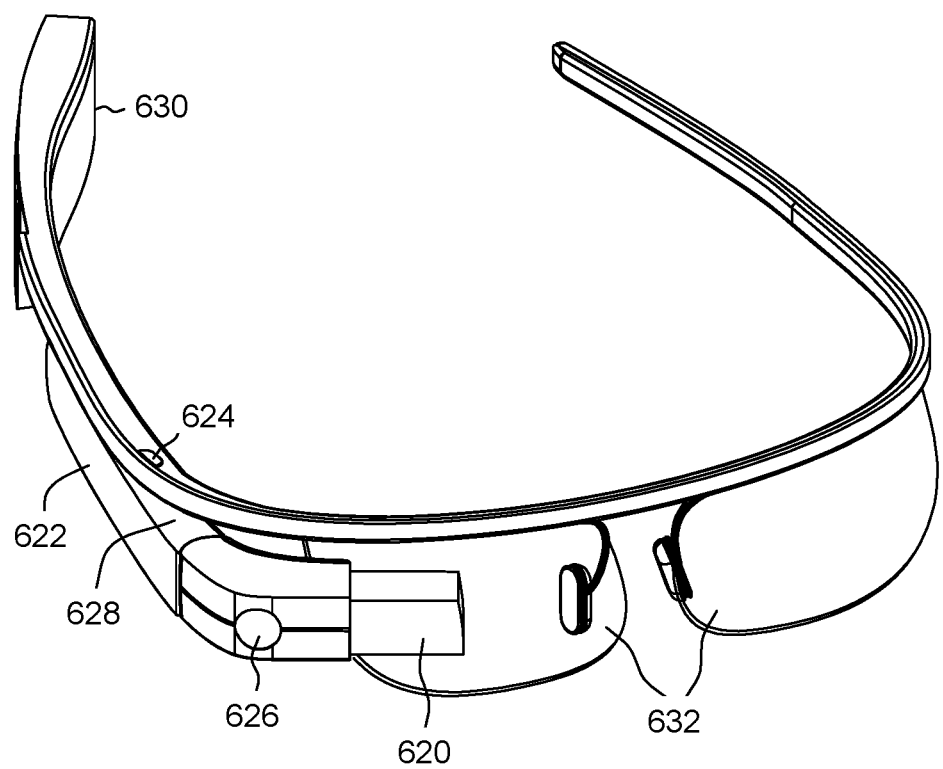
FIG. 6B depicts an example of a wearable device to incorporate or use aspects described herein.

FIG. 6B depicts another example of a computer system to incorporate and use aspects described herein. FIG. 6B depicts an example eyewear based wearable device, which may include many of the same types of components included in computer system 600 described above. In the example of FIG. 6B, the device is configured to be wearable on the head of the device user. The device includes a display 620 that is positioned in a peripheral vision line of sight of the user when the device is in operative position on the user's head. Suitable displays can utilize LCD, CRT, or OLED display technologies, as examples. Lenses 632 may optionally include active translucent displays, in which an inner and/or outer surface of the lenses are capable of displaying images and other content, for instance augmented reality content. This provides the ability to impose this content directly into the line of sight of the user, overlaying at least part of the user's view to the environment through the lenses. In particular embodiments described herein, content presented on the lens displays include AR models.

The device of FIG. 6B also includes touch input portion 622 that enable users to input touch-gestures in order to control functions of the device. Such gestures can be interpreted as commands, for instance a command to take a picture, or a command to launch a particular service. The device also includes button 624 in order to control function(s) of the device. Example functions include locking, shutting down, or placing the device into a standby or sleep mode.

Various other input devices are provided, such as camera 626, which can be used to capture images and/or video. The camera can also be used by the device to obtain an image of the user's view of his or her environment to use in, for instance, capturing images/videos of a scene. One or more microphones, proximity sensors, light sensors, accelerometers, speakers, GPS devices, and/or other input devices (not labeled) may be additionally provided, for instance within housing 628. Housing 628 can also include other electronic components, such as electronic circuitry, including processor(s), memory, and/or communications devices, such as cellular, short-range wireless (e.g. Bluetooth), or WiFi circuitry for connection to remote devices. Housing 628 can further include a power source, such as a battery to power components of the device. Additionally or alternatively, any such circuitry or battery can be included in enlarged end 630, which may be enlarged to accommodate such components. Enlarged end 630, or any other portion of the device, can also include physical port(s) (not pictured) used to connect the device to a power source to recharge a battery and/or any other external device, such as a computer. Such physical ports can be of any standardized or proprietary type, such as Universal Serial Bus (USB).

Aspects described herein may be incorporated into and/or use a cloud computing environment. It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based email). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for loadbalancing between clouds).

A cloud computing environment is service oriented with a focus on statelessness, low coupling, modularity, and semantic interoperability. At the heart of cloud computing is an infrastructure comprising a network of interconnected nodes. One such node is node 10 depicted in FIG. 7.

Computing node 10 is only one example of a suitable cloud computing node and is not intended to suggest any limitation as to the scope of use or functionality of embodiments of the invention described herein. Regardless, cloud computing node 10 is capable of being implemented and/or performing any of the functionality set forth hereinabove.

Figure 7:
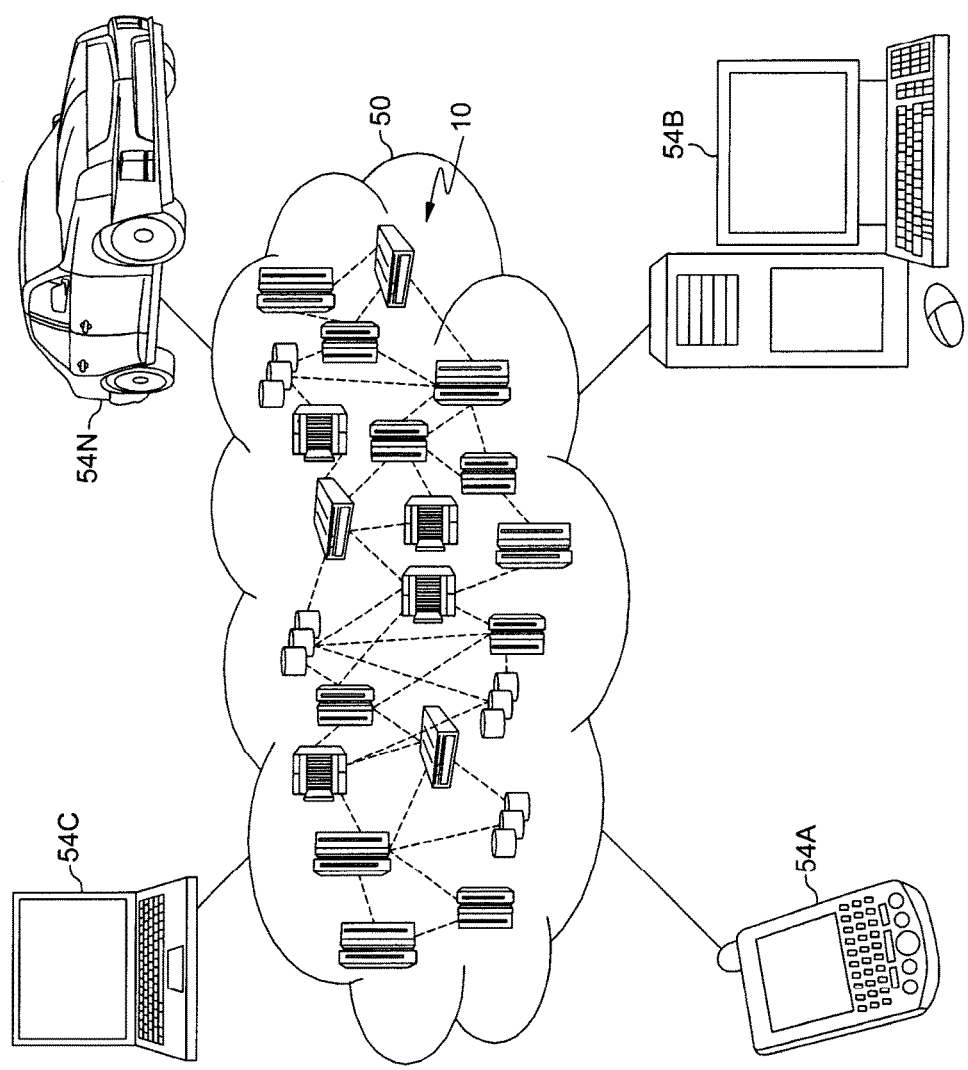
FIG. 7 depicts a cloud computing environment according to an embodiment of the present invention.

Referring to FIG. 7, illustrative cloud computing environment 50 is depicted. As shown, cloud computing environment 50 comprises one or more computing nodes 10 with which local computing devices used by cloud consumers, such as, for example, smartphone or other mobile device 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 7 are intended to be illustrative only and that computing nodes 10 and cloud computing environment 50 can communicate with any type of computerized device over any type of network and/or network addressable connection (e.g., using a web browser).

Figure 8:
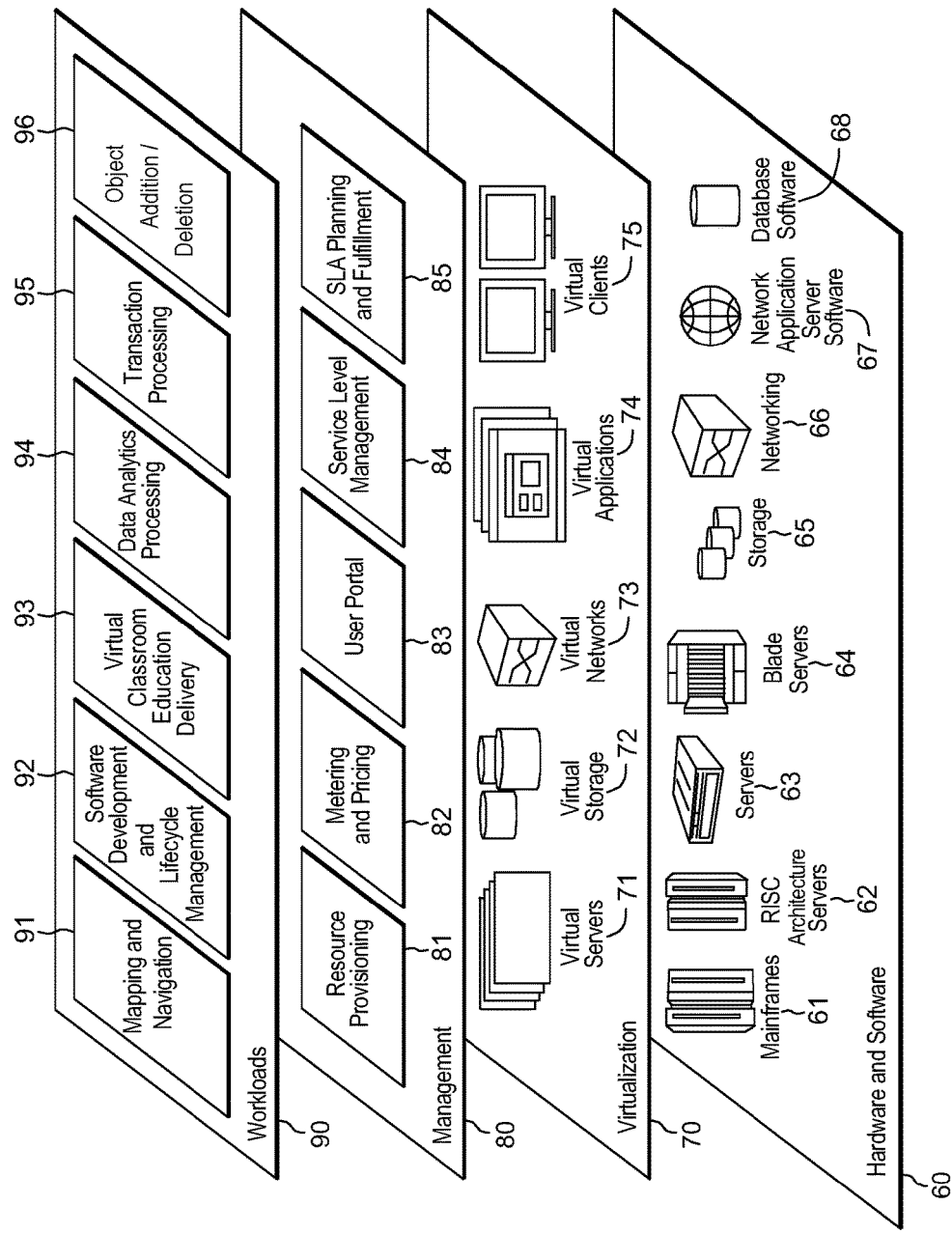
FIG. 8 depicts abstraction model layers according to an embodiment of the present invention.

Referring now to FIG. 8, a set of functional abstraction layers provided by cloud computing environment 50 (FIG. 7) is shown. It should be understood in advance that the components, layers, and functions shown in FIG. 8 are intended to be illustrative only and embodiments of the invention are not limited thereto. As depicted, the following layers and corresponding functions are provided:

Hardware and software layer 60 includes hardware and software components. Examples of hardware components include mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and object addition/deletion 96.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN)

or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In addition to the above, one or more aspects may be provided, offered, deployed, managed, serviced, etc. by a service provider who offers management of customer environments. For instance, the service provider can create, maintain, support, etc. computer code and/or a computer infrastructure that performs one or more aspects for one or more customers. In return, the service provider may receive payment from the customer under a subscription and/or fee agreement, as examples. Additionally or alternatively, the service provider may receive payment from the sale of advertising content to one or more third parties.

In one aspect, an application may be deployed for performing one or more embodiments. As one example, the deploying of an application comprises providing computer infrastructure operable to perform one or more embodiments.

As a further aspect, a computing infrastructure may be deployed comprising integrating computer readable code into a computing system, in which the code in combination with the computing system is capable of performing one or more embodiments.

As yet a further aspect, a process for integrating computing infrastructure comprising integrating computer readable code into a computer system may be provided. The computer system comprises a computer readable medium, in which the computer medium comprises one or more embodiments. The code in combination with the computer system is capable of performing one or more embodiments.

Although various embodiments are described above, these are only examples. For example, computing environments of other architectures can be used to incorporate and use one or more embodiments.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of one or more embodiments has been presented for purposes of illustration and description, but is not intended to be exhaustive or limited to in the form disclosed. Many modifications and variations will be apparent to those of ordinary skill in the art. The embodiment was chosen and described in order to best explain various aspects and the practical application, and to enable others of ordinary skill in the art to understand various embodiments with various modifications as are suited to the particular use contemplated.

What is claimed is:

1. A computer-implemented method comprising:

tracking, using a first one or more eye gaze tracking devices, eye gaze of each user of a first group of users who view an environment through respective transparent displays, the first group of users each having a respective field of view to the environment;

assessing, based on the tracking, whether an object present in the respective fields of view of the first group of users is clutter, the object being a physical object, in the environment, within the respective fields of view of the first group of users, or the object being an augmented reality model interposed in the respective fields of view of the first group of users on the respective transparent displays; and initiating a physical change to the environment based on the assessing, the physical change being one selected from the group consisting of: (i) based on the object being the physical object, deconstruction of that physical object in the environment, and (ii) based on the object being the augmented reality model, construction of a physical object based that augmented reality model.

2. The method of claim 1, wherein the assessing comprises determining, based on the tracking, an extent to which the first group of users avoid the object by looking around or away from the object.

3. The method of claim 1, wherein the assessing comprises measuring, based on the tracking, visual dwell time on and around the object by the first group of users.

4. The method of claim 1, wherein the assessing comprises identifying affordances of the object based on at least one selected from the group consisting of: (i) input from the first group of users, and (ii) correlating the object to another object having known affordances associated therewith.

5. The method of claim 1, wherein the object present in the respective fields of view of the first group of users is the physical object for which initiation of deconstruction of that physical object is performed, and wherein the method further comprises:

placing an augmented reality model of the physical object in fields of view of a second group of users who view the environment, the second group of users being a same group or different group from the first group of users;

scheduling removal of the physical object from the environment; and repeating the tracking and the assessing for the augmented reality model of the physical object, to assess based on interaction of the second group of users with the augmented reality model of the physical object whether the physical object is properly removed from the environment.

6. The method of claim 5, wherein the placing the augmented reality model of the physical object in the fields of view of the second group of users comprises interposing the augmented reality model of the physical object on transparent displays in lines of sight of the second group of users.

7. The method of claim 6, wherein the placing the augmented reality model of the physical object in the fields of view of the second group of users further comprises varying transparency of the augmented reality model of the physical object on the transparent displays over time at increasing transparency levels, wherein repeating the assessing comprises assessing interaction of the second group of users with the augmented reality model of the physical object at the increasing transparency levels to determine whether the physical object is properly removed from the environment.

8. The method of claim 5, wherein the initiating the physical change to the environment comprises confirming that the physical object is to be deconstructed.

9. The method of claim 1, wherein the object present in the respective fields of view of the first group of users comprises the augmented reality model, the augmented reality model being an augmented reality model of the physical object, the physical object being proposed to be constructed in the environment, and wherein the method further comprises:

determining that the physical object has been proposed for construction in the environment; and interposing the augmented reality model of the physical object on the respective transparent displays in lines of sight of the first group of users to present for the first group of users an augmented reality version of the physical object positioned at a location, in the environment, at which the physical object is proposed to be constructed, wherein the assessing assesses whether the augmented reality model of the physical object is clutter as an indicator of whether the physical object, if actually constructed as proposed at the location in the environment, will be clutter in the environment.

10. The method of claim 9, wherein the initiating the physical change to the environment is based on the assessing indicating that the physical object will not be clutter in the environment and comprises approving a proposal to construct the physical object in the environment.

11. The method of claim 9, wherein the physical object comprises an alteration to an existing physical object in the environment.

12. The method of claim 9, further comprising, based on construction of the physical object in the environment, repeating the tracking eye gaze for a second group of users who view the environment including the constructed physical object and the assessing, for the constructed physical object, to assess based on interaction of the second group of users with the constructed physical object whether the constructed physical object is clutter.

13. The method of claim 1, further comprising obtaining, from each user of at least one user of the first group of users, a respective utterance about the environment within the field of view of that user as the tracking tracks the eye gaze of that user, wherein the assessing is further based on the obtaining.

14. A computer system comprising:

a memory; and a processor in communication with the memory, wherein the computer system is configured to perform a method comprising:

tracking, using a first one or more eye gaze tracking devices, eye gaze of each user of a first group of users who view an environment through respective transparent displays, the first group of users each having a respective field of view to the environment;

assessing, based on the tracking, whether an object present in the respective fields of view of the first group of users is clutter, the object being a physical object, in the environment, within the respective fields of view of the first group of users, or the object being an augmented reality model interposed in the respective fields of view of the first group of users on the respective transparent displays; and initiating a physical change to the environment based on the assessing, the physical change being one selected from the group consisting of: (i) based on the object being the physical object, deconstruction of that physical object in the environment, and (ii) based on the object being the augmented reality model, construction of a physical object based on that augmented reality model.

15. The computer system of claim 14, wherein the assessing comprises:
- determining, based on the tracking, an extent to which the first group of users avoid the object by looking around or away from the object;
- measuring, based on the tracking, visual dwell time on and around the object by the first group of users; and
- identifying affordances of the object based on at least one selected from the group consisting of: (i) input from the first group of users, and (ii) correlating the object to another object having known affordances associated therewith.

16. The computer system of claim 14, wherein the object present in the respective fields of view of the first group of users is the physical object for which initiation of deconstruction of that physical object is performed, and wherein the method further comprises:
- placing an augmented reality model of the physical object in fields of view of a second group of users who view the environment, the second group of users being a same group or different group from the first group of users, wherein the placing comprises:
  - interposing the augmented reality model of the physical object on transparent displays in lines of sight of the second group of users; and
  - varying transparency of the augmented reality model of the physical object on the transparent displays over time at increasing transparency levels;
- scheduling removal of the physical object from the environment; and
- repeating the tracking and the assessing for the augmented reality model of the physical object, to assess based on interaction of the second group of users with the augmented reality model of the physical object whether the physical object is properly removed from the environment, wherein repeating the assessing comprises assessing interaction of the second group of users with the augmented reality model of the physical object at the increasing transparency levels to determine whether the physical object is properly removed from the environment.

17. The computer system of claim 14, wherein the object present in the respective fields of view of the first group of users comprises the augmented reality model, the augmented reality model being an augmented reality model of the physical object, the physical object being proposed to be constructed in the environment, and wherein the method further comprises:
- determining that the physical object has been proposed for construction in the environment; and
- interposing the augmented reality model of the physical object on the respective transparent displays in lines of sight of the first group of users to present for the first group of users an augmented reality version of the physical object positioned at a location, in the environment, at which the physical object is proposed to be constructed, wherein the assessing assesses whether the augmented reality model of the physical object is clutter as an indicator of whether the physical object, if actually constructed as proposed at the location in the environment, will be clutter in the environment.

18. A computer program product comprising:
- a computer readable storage medium readable by a processing circuit and storing instructions for execution by the processing circuit for performing a method comprising:
  - tracking, using a first one or more eye gaze tracking devices, eye gaze of each user of a first group of users who view an environment through respective transparent displays, the first group of users each having a respective field of view to the environment;
  - assessing, based on the tracking, whether an object present in the respective fields of view of the first group of users is clutter, the object being a physical object, in the environment, within the respective fields of view of the first group of users, or the object being an augmented reality model interposed in the respective fields of view of the first group of users on the respective transparent displays; and
  - initiating a physical change to the environment based on the assessing, the physical change being one selected from the group consisting of: (i) based on the object being the physical object, deconstruction of that physical object in the environment, and (ii) based on the object being the augmented reality model, construction of a physical object based on that augmented reality model.

19. The computer program product of claim 18, wherein the object present in the respective fields of view of the first group of users is the physical object for which initiation of deconstruction of that physical object is performed, and wherein the method further comprises:
- placing an augmented reality model of the physical object in fields of view of a second group of users who view the environment, the second group of users being a same group or different group from the first group of users, wherein the placing comprises:
  - interposing the augmented reality model of the physical object on transparent displays in lines of sight of the second group of users; and
  - varying transparency of the augmented reality model of the physical object on the transparent displays over time at increasing transparency levels;
- scheduling removal of the physical object from the environment; and
- repeating the tracking and the assessing for the augmented reality model of the physical object, to assess based on interaction of the second group of users with the augmented reality model of the physical object whether the physical object is properly removed from the environment, wherein repeating the assessing comprises assessing interaction of the second group of users with the augmented reality model of the physical object at the increasing transparency levels to determine whether the physical object is properly removed from the environment.

20. The computer program product of claim 18, wherein the object present in the respective fields of view of the first group of users comprises the augmented reality model, the augmented reality model being an augmented reality model of the physical object, the physical object being proposed to be constructed in the environment, and wherein the method further comprises:
- determining that the physical object has been proposed for construction in the environment; and
- interposing the augmented reality model of the physical object on the respective transparent displays in lines of sight of the first group of users to present for the first group of users an augmented reality version of the physical object positioned at a location, in the environment, at which the physical object is proposed to be constructed, wherein the assessing assesses whether the augmented reality model of the physical object is clutter as an indicator of whether the physical object, if actually constructed as proposed at the location in the environment, will be clutter in the environment.

* * * * *